(12) United States Patent
Yang et al.

(10) Patent No.: US 10,355,097 B2
(45) Date of Patent: Jul. 16, 2019

(54) THIN FILM TRANSISTOR, ARRAY SUBSTRATE, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Lu Yang, Beijing (CN); Wentao Wang, Beijing (CN); Xiaowen Si, Beijing (CN); Haifeng Xu, Beijing (CN); Jinfeng Wang, Beijing (CN); Lei Yan, Beijing (CN); Lei Yao, Beijing (CN); Feng Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/710,133

(22) Filed: Sep. 20, 2017

(65) Prior Publication Data
US 2018/0138281 A1    May 17, 2018

(30) Foreign Application Priority Data
Nov. 16, 2016   (CN) .......................... 2016 1 1030788

(51) Int. Cl.
| H01L 29/423 | (2006.01) |
| H01L 27/12 | (2006.01) |
| H01L 29/66 | (2006.01) |
| H01L 29/786 | (2006.01) |

(52) U.S. Cl.
CPC ...... *H01L 29/42384* (2013.01); *H01L 27/124* (2013.01); *H01L 27/1237* (2013.01); *H01L 29/66742* (2013.01); *H01L 29/78621* (2013.01); *H01L 29/78633* (2013.01); *H01L 29/78675* (2013.01)

(58) Field of Classification Search
CPC .............. H01L 29/42384; H01L 21/00; H01L 29/78675; H01L 29/66742; H01L 27/1237
See application file for complete search history.

(56) References Cited

U.S. PATENT DOCUMENTS 5,650,636 A * 7/1997 Takemura ........... G02F 1/13624
257/532
2004/0031964 A1   2/2004 Morita et al.

FOREIGN PATENT DOCUMENTS

| CN | 101950746 A | 1/2011 |
| CN | 105895706 A | 8/2016 |

OTHER PUBLICATIONS

First Office Action for Chinese Application No. 201611030788.6, dated Dec. 29, 2018, 6 Pages.

* cited by examiner

*Primary Examiner* — Kyoung Lee
(74) *Attorney, Agent, or Firm* — Brooks Kushman P.C.

(57) ABSTRACT

The present disclosure provides a thin film transistor (TFT), an array substrate, a display panel and a display device. The TFT includes a gate electrode, a gate insulating layer, a source electrode, a drain electrode and an active layer arranged on a base substrate, wherein there is a plurality of overlapping regions separated from each other where a projection of the gate electrode on the base substrate and a projection of the active layer on the base substrate overlap each other.

20 Claims, 4 Drawing Sheets

THIN FILM TRANSISTOR, ARRAY SUBSTRATE, DISPLAY PANEL AND DISPLAY DEVICE

CROSS-REFERENCE TO RELATED APPLICATION

The present application claims priority to Chinese patent application No. 201611030788.6 filed on Nov. 16, 2016, which is incorporated herein in its entirety by reference.

TECHNICAL FIELD

The present disclosure relates to the field of display technology, and more particularly to a thin film transistor (TFT), an array substrate, a display panel and a display device.

BACKGROUND

In a low temperature poly-silicon (LTPS) display product, a thin film transistor (TFT) is configured to drive a pixel electrode of a display region so as to display a picture. Therefore, a characteristic of the TFT has always been an important index for monitoring the display product.

The characteristic of the TFT not only can reflect quality of the display product, but also can show a stability of a production line. A large leakage current of the TFT could cause instability in a display picture of the display product, thereby generating a dither residual image.

In view of this, currently, a solution for reducing the leakage current of the LTPS product is urgently needed to improve a quality of the display picture.

SUMMARY

In one aspect, the present disclosure provides a thin film transistor (TFT) including a gate electrode, a gate insulating layer, a source electrode, a drain electrode and an active layer arranged on a base substrate, wherein there is a plurality of overlapping regions separated from each other where a projection of the gate electrode on the base substrate and a projection of the active layer on the base substrate overlap each other.

Optionally, the active layer includes a bottom portion and an extending portion extending from two ends of the bottom portion, and the bottom portion and the extending portion together form a U shape, and there are three overlapping regions separated from each other where the projection of the gate electrode on the base substrate and a projection of the U shape on the base substrate overlap each other.

Optionally, the gate electrode includes a first branch portion that is parallel or substantially parallel to an extending direction of the bottom portion of the U shape and a second branch portion that extends from the first branch portion and at a preset nonzero angle relative to the first branch portion; there are two overlapping regions where a projection of the first branch portion on the base substrate and the projection of the active layer on the base substrate overlap each other; and there is one overlapping region where a projection of the second branch portion on the base substrate and the projection of the active layer on the base substrate overlap each other. Furthermore, the first branch portion is perpendicular to the second branch portion.

Optionally, there is one overlapping region where the projection of the gate electrode on the base substrate and a projection of each of two vertical portions of the U shape on the base substrate overlap each other, and there is one overlapping region where the projection of the gate electrode on the base substrate and a projection of the bottom portion of the U shape on the base substrate overlap each other.

Optionally, there are two overlapping regions separated from each other where the projection of the gate electrode on the base substrate and a projection of one of two vertical portions of the U shape on the base substrate overlap each other, and there is one overlapping region where the projection of the gate electrode on the base substrate and a projection of the other of the two vertical portions of the U shape on the base substrate overlap each other.

Optionally, the active layer has a plurality of lightly doped drain regions separated from each other, and the overlapping regions are located between projections of the lightly doped drain electrode regions on the base substrate.

In another aspect, the present disclosure also provides an array substrate including a base substrate and a plurality of the above TFTs formed on the base substrate.

Optionally, the array substrate further includes a plurality of gate lines configured to drive the plurality of TFTs, wherein the active layer includes a bottom portion and an extending portion extending from two ends of the bottom portion, the bottom portion and the extending portion form a U shape, the gate electrode of each of the TFTs includes a first branch portion that is parallel or substantially parallel to an extending direction of the bottom portion of the U shape and a second branch portion that extends from the first branch portion and at a preset nonzero angle relative to the first branch portion, and the first branch portion of each of the TFTs forms a part of a respective gate line.

Optionally, the gate lines are arranged in rows on the base substrate, and second branch portions of at least two adjacent TFTs in a same row are connected together.

Optionally, second branch portions of all TFTs in a same row are connected together.

Optionally, the array substrate further includes a plurality of data lines configured to drive the plurality of TFTs, wherein an extending direction of each of data lines is identical or approximately identical to a direction of a vertical portion of a respective U shape.

Optionally, black matrices configured to shield the first branch portion and the second branch portion.

Optionally, the black matrices are arranged between the base substrate and the TFTs.

In addition, the present disclosure further provides a display panel including the above array substrate.

In addition, the present disclosure further provides a display device including the above display panel.

DETAILED DESCRIPTION

In order to make the technical problems to be solved, the technical solutions and the advantages of the present disclosure more apparent, the present disclosure will be described hereinafter in a detail manner in conjunction with the drawings and specific embodiments.

For undesirable phenomena such as a dither display picture due to the large leakage current of the TFT of the display product in a prior art, the present disclosure provides the following solutions.

Figure 1:
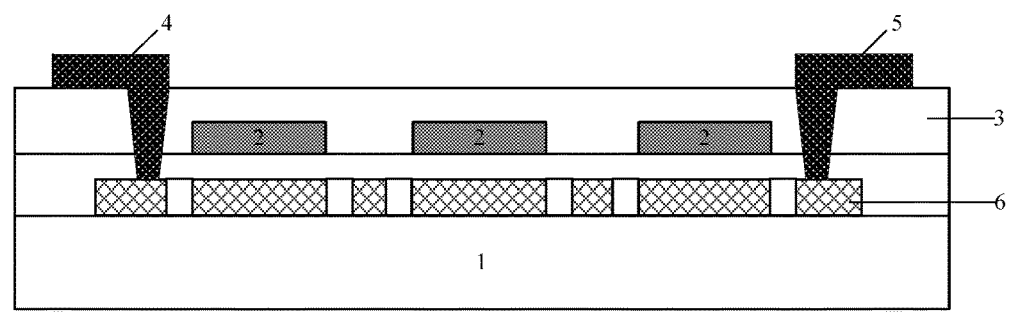
FIG. 1 and FIG. 2 are schematic views showing a structure of a TFT according to some embodiments of the present disclosure.
Figure 2:
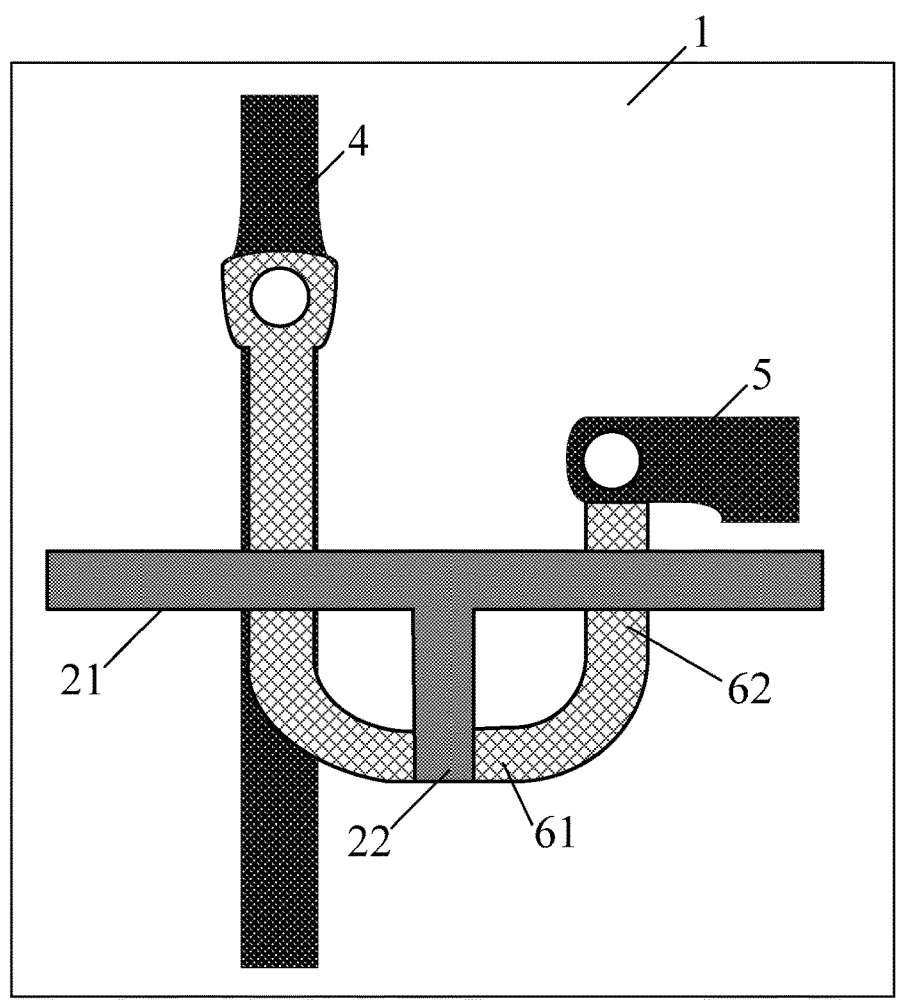

In one aspect, referring to FIG. 1 and FIG. 2, the present disclosure provides in at least one embodiment a thin film transistor (TFT). The TFT according to the present disclosure includes a gate electrode 2, a gate insulating layer 3, a source electrode 4, a drain electrode 5 and an active layer 6 arranged on a base substrate 1.

Unlike the related art, on the basis of the above structure, in the TFT according to the present disclosure, there is a plurality of overlapping regions separated from each other where a projection of the gate electrode 2 on the base substrate 1 and a projection of the active layer 6 on the base substrate 1 overlap each other.

It can be seen from the structure shown in FIG. 1 and FIG. 2 that, the gate electrode and the active layer of the TFT according to the present embodiment have a plurality of overlapping locations. in principle, a structure of one TFT is equalized as a plurality of switches, and such a design may effectively reduce the leakage current of the TFT while reducing adverse influence on a performance of the TFT brought by the leakage current, thereby improving undesirable phenomena such as the dithering display picture of the display product when the TFT is applied to the display product.

The TFT according to the present embodiment will be described hereinafter in a detail manner in conjunction with a specific implementing manner.

Referring to FIG. 2, the active layer of the present embodiment includes a bottom portion 61 and an extending portion 62 extending from two ends of the bottom portion 61. The bottom portion 61 and the extending portion 62 together form a U shape.

Furthermore, the gate electrode 2 includes a first branch portion 21 whose extending direction is parallel or substantially parallel to an extending direction of the bottom portion 61 of the U shape (in other words, the extending direction of the first branch portion 21 is parallel or substantially parallel to the extending direction of the bottom portion 61, or the extending direction of the first branch portion 21 is perpendicular or substantially perpendicular to a vertical portion of the U shape) and a second branch portion 22 that extends from the first branch portion 21 and at a preset nonzero angle relative to the first branch portion 21 (FIG. 2 exemplarily illustrating a case of the first branch portion 21 being perpendicular to the second branch portion 22). There are two overlapping regions where a projection of the first branch portion 21 on the base substrate 1 and the projection of the active layer 6 on the base substrate 1 overlap each other; and there is an overlapping region where a projection of the second branch portion 22 on the base substrate 1 and the projection of the active layer 6 on the base substrate 1 overlap each other.

It should be understood that, in the embodiments of the present disclosure, shapes of the active layer and the gate electrode are not limited, and locations of the overlapping regions are not limited too. For example, there may be an overlapping region where the projection of the gate electrode on base substrate and a projection of each of two vertical portions of the U shape on the base substrate overlap each other, and there may be an overlapping region where the projection of the gate electrode on the base substrate and a projection of the bottom portion of the U shape on the base substrate overlap each other. For another example, there may be two overlapping regions separated from each other where the projection of the gate electrode on the base substrate and a projection of one of two vertical portions of the U shape on the base substrate overlap each other, and there may one overlapping region where the projection of the gate electrode on the base substrate and a projection of the other of the two vertical portions of the U shape on the base substrate overlap each other.

In addition, in the case that the gate electrode 2 of the present embodiment is formed above the active layer 6, after forming the gate electrode 2, through the gate electrode 2 serving as a mask, the active layer 6 may be subjected to an ion injection, such that active layer 6 is formed with a plurality of lightly doped drain (LDD) regions.

Figure 3:
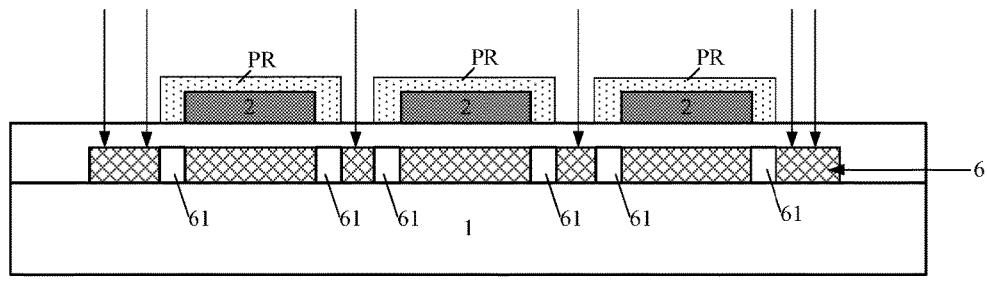
FIG. 3 is a schematic view showing an injection of ions into an active layer though a gate electrode (serving as a mask) of a TFT according to some embodiments of the present disclosure.

As an exemplary introduction, referring to FIG. 3, FIG. 3 is a schematic view showing subjecting the active layer 6 to an N+ heavy doping process (one step of ion injecting process mainly used for doping high dose of pentavalent P+ ions into the active layer 6). A wet etching technique may be adopted to manufacture a pattern of the gate electrode 2, and a photoresist RP is used for protecting gate electrode 2 during the etching process. After manufacturing the gate electrode 2, a part of the photoresist RP will be remained. In the N doping injecting process, a gate electrode with the residual photoresist RP may be served as the mask. Hence, the gate electrode 2 and the active layer 6 directly opposite to the photoresist RP will not be injected with high dose of pentavalence P+ ion. After the N+ doping injecting process, the photoresist RP may be removed, and the active layer 6 is subjected to an N+ light doping process (one step of ion injecting process mainly used for doping low dose of pentavalence P+ ion to the active layer 6). Obviously, in FIG. 3, only regions 61 where the active layer 6 is covered by the photoresist RP are subjected to one N+ light-doing process. Therefore, through these regions 61 serving as lightly doped drain regions, the leakage current of the TFT may be effectively reduced, thus further improving a working performance of the TFT.

Thus, it can be seen that, the adopted structure of the gate electrode according to the present embodiment not only may serves as the mask during the ion injecting process of the active layer, but also may increase the number of lightly doped drain regions of the active layer.

Figure 4:
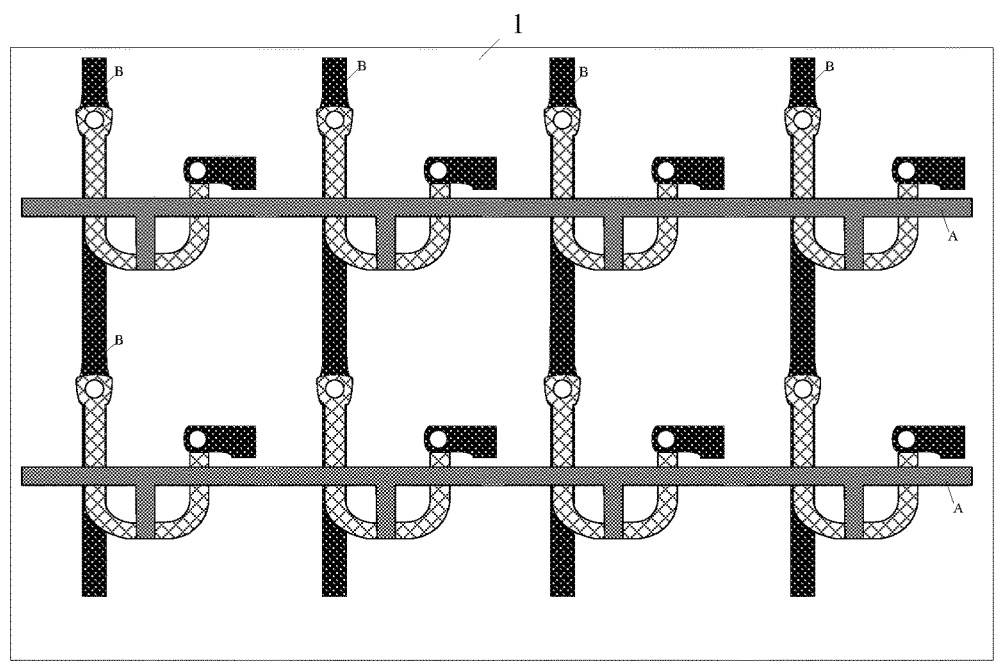
FIGS. 4-7 are schematic views showing a structure of an array substrate according to some embodiments of the present disclosure.

In another aspect, the present disclosure further provides in at least one embodiment an array substrate, as shown in FIG. 4, the array substrate includes a base substrate 1 and a plurality of TFTs formed on the base substrate 1 (FIG. 4 exemplarily illustrating a case of two TFTs).

The array substrate according to embodiments of the present further includes a plurality of gate lines A and a plurality of data lines B, configured to drive the plurality of TFTs. Further referring to FIG. 1, the first branch portion 21 of the TFT shown in FIG. 1 serves as a part of the gate line A in FIG. 4.

Figure 5:
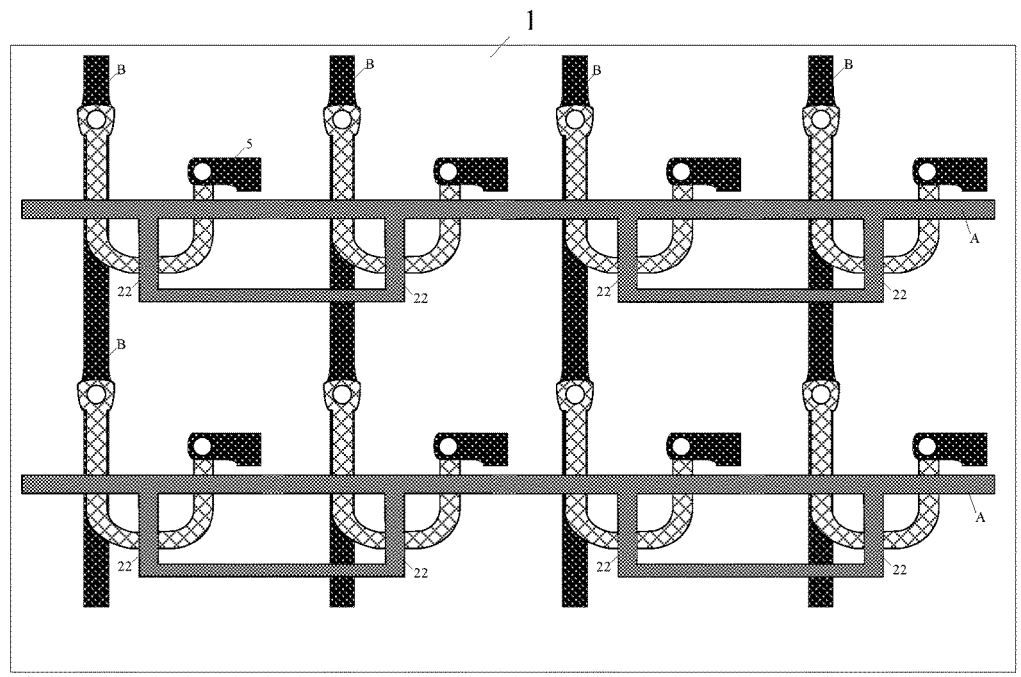

Furthermore, referring to FIG. 5, the gate lines A are arranged in rows on the base substrate, among TFTs in a same row, second branch portions 22 of at least two adjacent TFTs are connected together.

It can be seen from FIG. 5 that, a part of each gate line A according to the present embodiment forms two paths in parallel connection, so as to prevent an invalidation (i.e., an open gate phenomenon) of the TFT driven by the gate line caused by disconnection of one damaged path due to an external force, and to prevent bright spots on the display picture from being generated.

Figure 6:
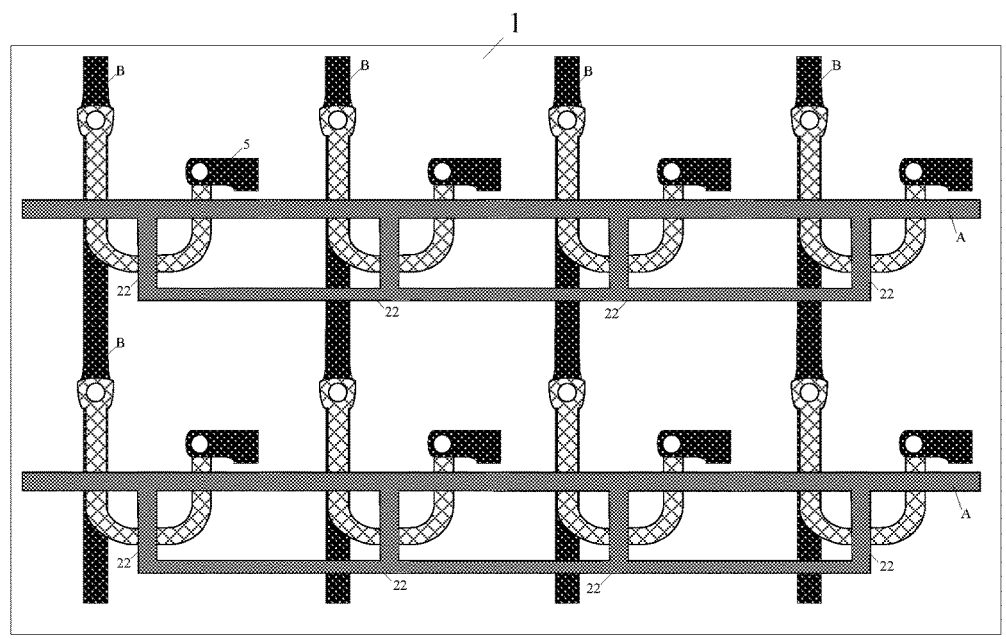

Obviously, as another solution, further referring to FIG. 6, according to the present embodiment, among TFTs in a same row, second branch portions 22 of all TFTs may be connected together, such that driving of TFT will not be affected, even if in the case of occurrence of disconnection of a part of the gate line A.

Obviously, on the basis of the structural design according to the present embodiment shown in FIG. 5 and FIG. 6, since an occurrence probability of gate open of the gate lines is lowered, in the manufacturing process, the gate line may be thinner, thereby reducing an area of non-display region and increasing an aperture ratio of the display, so as to significantly improve the picture quality.

Figure 7:
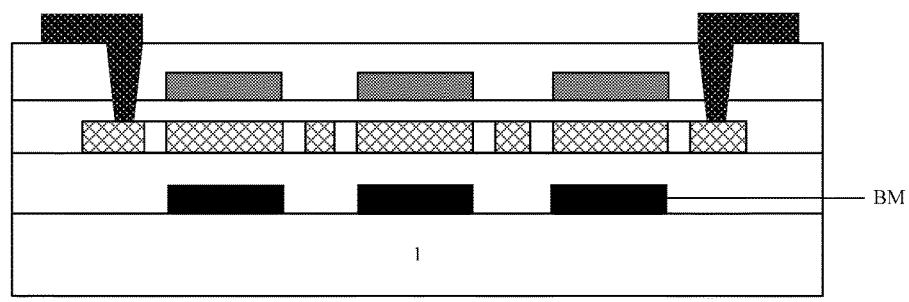

In addition, the TFT of the array substrate according to the present disclosure may further include black matrices BMs configured to shield the first branch portion and the second branch portion. Referring to FIG. 7, in a practical application, the black matrices BMs may be arranged between the base substrate 1 and the TFTs shown in FIG. 1.

In addition, the present disclosure further provides a display panel including any above-mentioned array substrate and a display device including the display panel. On the basis of the array substrate according to the present disclosure, the display panel and the display device according to the present embodiment may effectively prevent the occurrence of the dithering and bright spots on the screen, thus improving the picture quality, and providing a better user experience.

The above are the optional embodiments of the present disclosure and it should be noted that, a person skilled in the art may make improvements and modifications without departing from the principle of the present disclosure, and these improvements and modifications shall also fall within the scope of the present disclosure. In addition, what should be further noted is that, in the embodiments of the present disclosure, different function diagram layers in drawings neither represent sequence thereof in the manufacturing process, nor represent position relationship between these function diagram layers.

What is claimed is:

1. A thin film transistor (TFT) comprising a gate electrode, a gate insulating layer, a source electrode, a drain electrode and an active layer arranged on a base substrate, wherein there is a plurality of overlapping regions separated from each other where a projection of the gate electrode on the base substrate and a projection of the active layer on the base substrate overlap each other,
wherein the active layer comprises a bottom portion and an extending portion extending from two ends of the bottom portion, and the bottom portion and the extending portion together form a U shape; and there are three overlapping regions separated from each other where the projection of the gate electrode on the base substrate and a projection of the U shape on the base substrate overlap each other,
wherein the gate electrode comprises a first branch portion that is parallel or substantially parallel to an extending direction of the bottom portion of the U shape and a second branch portion that extends from the first branch portion and at a preset nonzero angle relative to the first branch portion; there are two overlapping regions where a projection of the first branch portion on the base substrate and the projection of the active layer on the base substrate overlap each other; and there is one overlapping region where a projection of the second branch portion on the base substrate and the projection of the active layer on the base substrate overlap each other.

2. The TFT according to claim 1, wherein
the first branch portion is perpendicular to the second branch portion.

3. The TFT according to claim 1, wherein
the active layer has a plurality of lightly doped drain electrode regions separated from each other, and the overlapping regions are located between projections of the lightly doped drain electrode regions on the base substrate.

4. An array substrate comprising a base substrate and a plurality of TFTs formed on the base substrate,
wherein each of the plurality of TFTs comprises a gate electrode, a gate insulating layer, a source electrode, a drain electrode and an active layer arranged on the base substrate, wherein there is a plurality of overlapping regions separated from each other where a projection of the gate electrode on the base substrate and a projection of the active layer on the base substrate overlap each other,
wherein the active layer comprises a bottom portion and an extending portion extending from two ends of the bottom portion, and the bottom portion and the extending portion together form a U shape; and there are three overlapping regions separated from each other where the projection of the gate electrode on the base substrate and a projection of the U shape on the base substrate overlap each other,
wherein the gate electrode comprises a first branch portion that is parallel or substantially parallel to an extending direction of the bottom portion of the U shape and a second branch portion that extends from the first branch portion and at a preset nonzero angle relative to the first branch portion; there are two overlapping regions where a projection of the first branch portion on the base substrate and the projection of the active layer on the base substrate overlap each other; and there is one overlapping region where a projection of the second branch portion on the base substrate and the projection of the active layer on the base substrate overlap each other.

5. The array substrate according to claim 4, further comprising a plurality of gate lines configured to drive the plurality of TFTs;
wherein the active layer comprises a bottom portion and an extending portion extending from two ends of the bottom portion, the bottom portion and the extending portion form a U shape, the gate electrode of each of the TFTs comprises a first branch portion that is parallel or substantially parallel to an extending direction of the bottom portion of the U shape and a second branch portion that extends from the first branch portion and at a preset nonzero angle relative to the first branch portion, and the first branch portion of each of the TFTs forms a part of a respective gate line.

6. The array substrate according to claim 5, wherein
the gate lines are arranged in rows on the base substrate, and second branch portions of at least two adjacent TFTs in a same row are connected together.

7. The array substrate according to claim 6, wherein
second branch portions of all TFTs in a same row are connected together.

8. The array substrate according to claim 5, further comprising a plurality of data lines configured to drive the plurality of TFTs, wherein an extending direction of each of data lines is identical or approximately identical to a direction of a vertical portion of a respective U shape.

9. The array substrate according to claim 5, further comprising black matrices configured to shield the first branch portion and the second branch portion.

10. The array substrate according to claim 9, wherein the black matrices are arranged between the base substrate and the TFTs.

11. A display panel comprising the array substrate according to claim 4.

12. A display device comprising the display panel according to claim 11.

13. An array substrate comprising a base substrate and a plurality of TFTs formed on the base substrate,
wherein each of the plurality of TFTs comprises a gate electrode, a gate insulating layer, a source electrode, a drain electrode and an active layer arranged on the base substrate, wherein there is a plurality of overlapping regions separated from each other where a projection of the gate electrode on the base substrate and a projection of the active layer on the base substrate overlap each other,
wherein the active layer comprises a bottom portion and an extending portion extending from two ends of the bottom portion, and the bottom portion and the extending portion together form a U shape; and there are three overlapping regions separated from each other where the projection of the gate electrode on the base substrate and a projection of the U shape on the base substrate overlap each other,
wherein the gate electrode comprises a first branch portion that is parallel or substantially parallel to an extending direction of the bottom portion of the U shape and a second branch portion that extends from the first branch portion and at a preset nonzero angle relative to the first branch portion; there are two overlapping regions where a projection of the first branch portion on the base substrate and the projection of the active layer on the base substrate overlap each other; and there is one overlapping region where a projection of the second branch portion on the base substrate and the projection of the active layer on the base substrate overlap each other, and
wherein the first branch portion is perpendicular to the second branch portion.

14. The array substrate according to claim 13, further comprising a plurality of gate lines configured to drive the plurality of TFTs;
wherein the active layer comprises a bottom portion and an extending portion extending from two ends of the bottom portion, the bottom portion and the extending portion form a U shape, the gate electrode of each of the TFTs comprises a first branch portion that is parallel or substantially parallel to an extending direction of the bottom portion of the U shape and a second branch portion that extends from the first branch portion and at a preset nonzero angle relative to the first branch portion, and the first branch portion of each of the TFTs forms a part of a respective gate line.

15. The array substrate according to claim 14, wherein the gate lines are arranged in rows on the base substrate, and second branch portions of at least two adjacent TFTs in a same row are connected together.

16. The array substrate according to claim 15, wherein second branch portions of all TFTs in a same row are connected together.

17. The array substrate according to claim 14, further comprising a plurality of data lines configured to drive the plurality of TFTs, wherein an extending direction of each of data lines is identical or approximately identical to a direction of a vertical portion of a respective U shape.

18. The array substrate according to claim 14, further comprising black matrices configured to shield the first branch portion and the second branch portion.

19. The array substrate according to claim 18, wherein the black matrices are arranged between the base substrate and the TFTs.

20. The array substrate according to claim 13, wherein the active layer has a plurality of lightly doped drain electrode regions separated from each other, and the overlapping regions are located between projections of the lightly doped drain electrode regions on the base substrate.

* * * * *